(12) United States Patent
Chang

(10) Patent No.: US 7,017,627 B2
(45) Date of Patent: Mar. 28, 2006

(54) NITROGEN-FILLING SYSTEM

(75) Inventor: Chih-Kang Chang, Taipei (TW)

(73) Assignee: Power Geode Technology Co., Ltd., Taipei (TW)

( * ) Notice: Subject to any disclaimer, the term of this patent is extended or adjusted under 35 U.S.C. 154(b) by 0 days.

(21) Appl. No.: 10/893,046

(22) Filed: Jul. 16, 2004

(65) Prior Publication Data

US 2005/0056341 A1    Mar. 17, 2005

(30) Foreign Application Priority Data

Sep. 15, 2003    (TW) ............................... 92216566 U

(51) Int. Cl.
*B65B 1/04*    (2006.01)
(52) U.S. Cl. .................... 141/98; 141/69; 141/88; 141/89; 141/91; 141/231
(58) Field of Classification Search .................... 141/4, 141/8, 59, 63–67, 69, 70, 85, 87–89, 93, 141/91, 95, 98, 231; 206/710–712; 414/217, 414/292, 937, 939, 940, 331.01, 331.04
See application file for complete search history.

(56) References Cited

U.S. PATENT DOCUMENTS

| | | | | |
|---|---|---|---|---|
| 5,810,062 A | * | 9/1998 | Bonora et al. | ............... 141/351 |
| 5,879,458 A | * | 3/1999 | Roberson et al. | ........... 118/715 |
| 6,467,626 B1 | * | 10/2002 | Misaka | ....................... 206/710 |

* cited by examiner

*Primary Examiner*—Timothy L. Maust
(74) *Attorney, Agent, or Firm*—Volpe and Koenig, P.C.

(57) ABSTRACT

A nitrogen-filling system is provided. A nitrogen-filling system includes a carrier including a main body for carrying at least one wafer box having at least a wafer, and a closing cover mounted on the carrier main body so as to formed a closed space around the wafer box, and a transporting vehicle for carrying the carrier and a nitrogen-filling apparatus set there on for filling the closed space with nitrogen so as to enhance a stability of the wafer in the carrier.

20 Claims, 5 Drawing Sheets

NITROGEN-FILLING SYSTEM

FIELD OF THE INVENTION

The present invention relates to a nitrogen-filling system, and more particularly to a nitrogen-filling system for filling the closed space with nitrogen around the wafer boxes so as to enhance a stability of the wafers in the carrier.

BACKGROUND OF THE INVENTION

Generally, there are two types of 12-inch front opening wafer boxes. One is the front opening unified pod (FOUP) for the indoor processing usage, and the other is the front opening shipping box (FOSB) for the outdoor transportation usage.

The front opening shipping boxes (FOSB) are often set on a carrier such as a hand-operated cart, and then the carrier is put in a truck for transportation from A place to B place. During the transportation, the carrier is often directly put in the truck, and nothing is done to keep the wafer boxes from being exposed to the air. Since the wafer boxes are exposed to the air, it is easy to cause the quality changes of the wafers in the wafer boxes. Sometimes, the damage may be so serious that the wafers cannot be used anymore and have to be abandoned.

From the above description, it is known that the transportation of the wafer boxes is not ideal. Therefore, how to reduce the instable qualities of the wafer boxes has become a major problem waiting to be solved in the industry. In order to overcome the drawbacks in the prior art, a nitrogen-filling system is provided. The particular design in the present invention not only solves the problem that the wafer boxes are exposed to the air, but also enhances the stability of the wafers in the carrier during the transportation process by a truck.

SUMMARY OF THE INVENTION

The main purpose of the present invention is to provide a nitrogen-filling system for filling the closed space around the wafer boxes with nitrogen.

It is one object of the present invention to provide a closing cover mounted on the main body of the carrier to form a closed space in an inner part of the carrier.

It is another object of the present invention to provide a pull-type cabinet for positioning and conveniently exchanging a nitrogen cylinder so as to supplement a safe amount of nitrogen to the closed space.

In accordance with an aspect of the present invention, a nitrogen-filling system includes a carrier including a main body for carrying at least one wafer box having at least a wafer therein, and a closing cover mounted on said carrier main body so as to form a closed space around the wafer box, and a transporting vehicle for carrying the carrier and a nitrogen-filling apparatus set there on for filling the closed space with nitrogen so as to enhance a stability of the wafer in the carrier.

Preferably, the nitrogen-filling apparatus further includes a pull-type cabinet for positioning and conveniently exchanging a nitrogen cylinder, a pressure sensor for detecting a safe amount of nitrogen in the nitrogen cylinder, and a transporting pipe for transporting nitrogen from the nitrogen cylinder to the closed space.

Preferably, the wafer box is a front opening shipping box (FOSB).

Preferably, the carrier of the wafer box is a hand-operated cart, and the transporting pipe of the nitrogen-filling apparatus is employed to connect a joint of the transporting vehicle and a joint of the hand-operated cart for forming a connection between the nitrogen-filling apparatus and the hand-operated cart.

Preferably, the closed space of the main body is an airtight space, and the joint on the hand-operated cart has a check inlet to check an outflow of the nitrogen in the airtight space.

Preferably, a foam strip is sealed on the main body so as to enhance an airtight effect.

Preferably, the transporting vehicle is a truck.

In accordance with another aspect of the present invention, a nitrogen-filling system for filling nitrogen into an inner part of a carrier having a main body and a closing element mounted on the main body for forming a closed space includes a nitrogen-filling apparatus for filling the closed space with nitrogen so as to enhance a stability of an object in the carrier.

Preferably, the carrier carries at least one wafer box therein; the closing element is a closing cover; the closed space is formed around the wafer box; the nitrogen-filling apparatus is mounted on a transporting vehicle; and the object is a wafer in the wafer box.

Preferably, the nitrogen-filling apparatus further includes a pull-type cabinet for positioning and conveniently exchanging a nitrogen cylinder, a pressure sensor for detecting a safe amount of nitrogen in the nitrogen cylinder, and a transporting pipe for transporting nitrogen from the nitrogen cylinder to the closed space.

Preferably, the wafer box is a front opening shipping box (FOSB).

Preferably, the carrier of the wafer box is a hand-operated cart, and the transporting pipe of the nitrogen-filling apparatus is employed to connect a joint of the transporting vehicle and a joint of the hand-operated cart for forming a connection between the nitrogen-filling apparatus and the hand-operated cart.

Preferably, the closed space of the main body is an airtight space, and the joint on the hand-operated cart has a check inlet to check an outflow of nitrogen in the airtight space.

Preferably, a foam strip is sealed on the main body so as to enhance an airtight function.

Preferably, the transporting vehicle is a truck.

In accordance with another aspect of the present invention, a nitrogen-filling system includes a carrier including a main body for carrying at least one wafer box having at least a wafer therein, and a closing cover mounted on the carrier main body so as to form a closed space around the wafer box, and a nitrogen-filling apparatus for filling the closed space with nitrogen so as to enhance a stability of the wafer in the carrier.

Preferably, the nitrogen-filling apparatus is set on a transporting vehicle.

Preferably, the nitrogen-filling apparatus further includes: a pull-type cabinet for positioning and conveniently exchanging a nitrogen cylinder, a pressure sensor for detecting a safe amount of nitrogen in the nitrogen cylinder, and a transporting pipe for transporting nitrogen from the nitrogen cylinder to the closed space.

Preferably, the wafer box is a front opening shipping box (FOSB).

Preferably, the carrier of the wafer box is a hand-operated cart, and the transporting pipe of the nitrogen-filling apparatus is employed to connect a joint of the transporting vehicle and a joint of the hand-operated cart for forming a connection between the nitrogen-filling apparatus and the hand-operated cart.

Preferably, the closed space of the main body is an airtight space, and the joint on the hand-operated cart has a check inlet to check an outflow of nitrogen in the airtight space.

Preferably, a foam strip is sealed on the main body so as to enhance an airtight effect.

Preferably, the transporting vehicle is a truck.

The foregoing and other features and advantages of the present invention will be more clearly understood through the following descriptions with reference to the drawings, in which:

DETAILED DESCRIPTION OF THE PREFERRED EMBODIMENT

Figure 1:
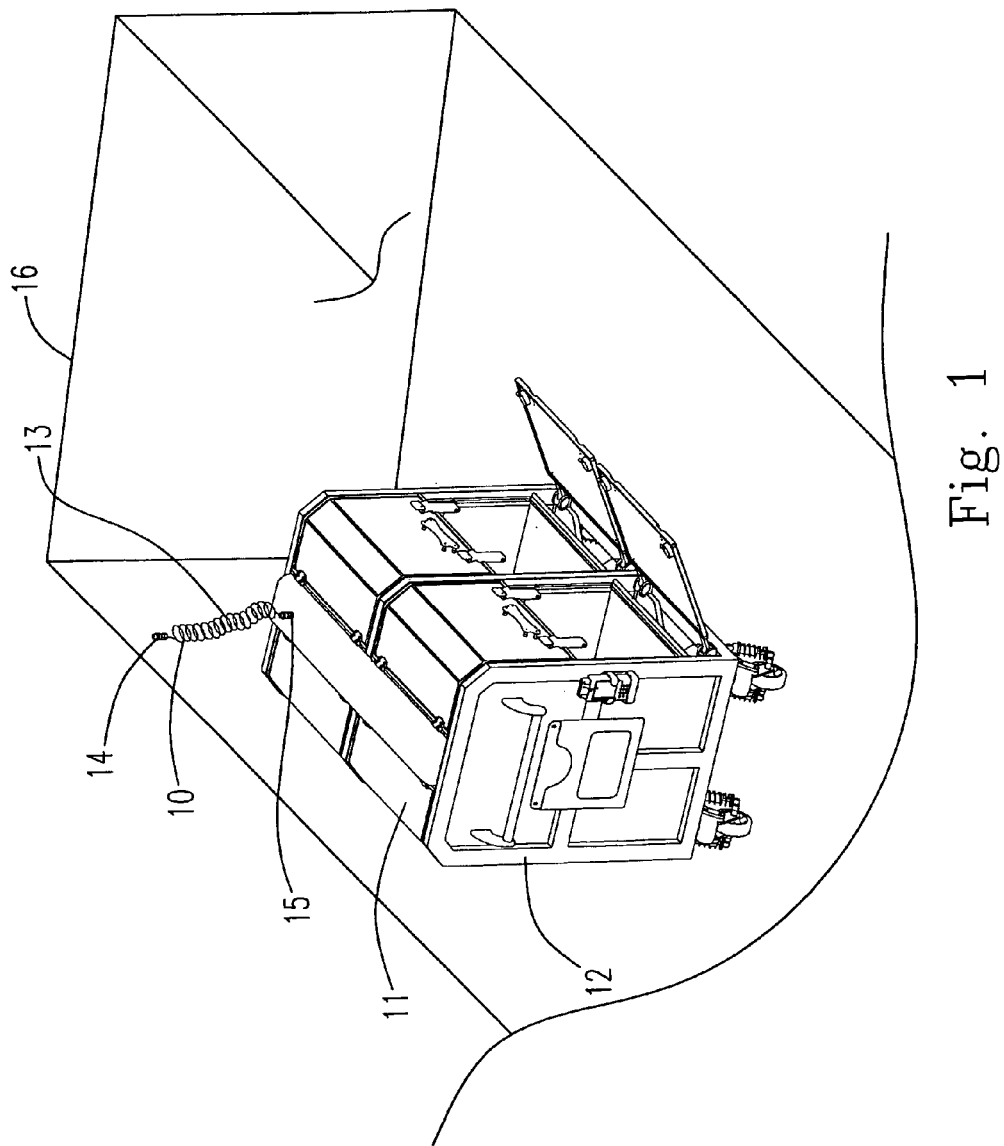
FIG. 1 is a three-dimensional view showing a nitrogen-filling system having a carrier of the wafer box according to a preferred embodiment of the present invention.
Figure 2:
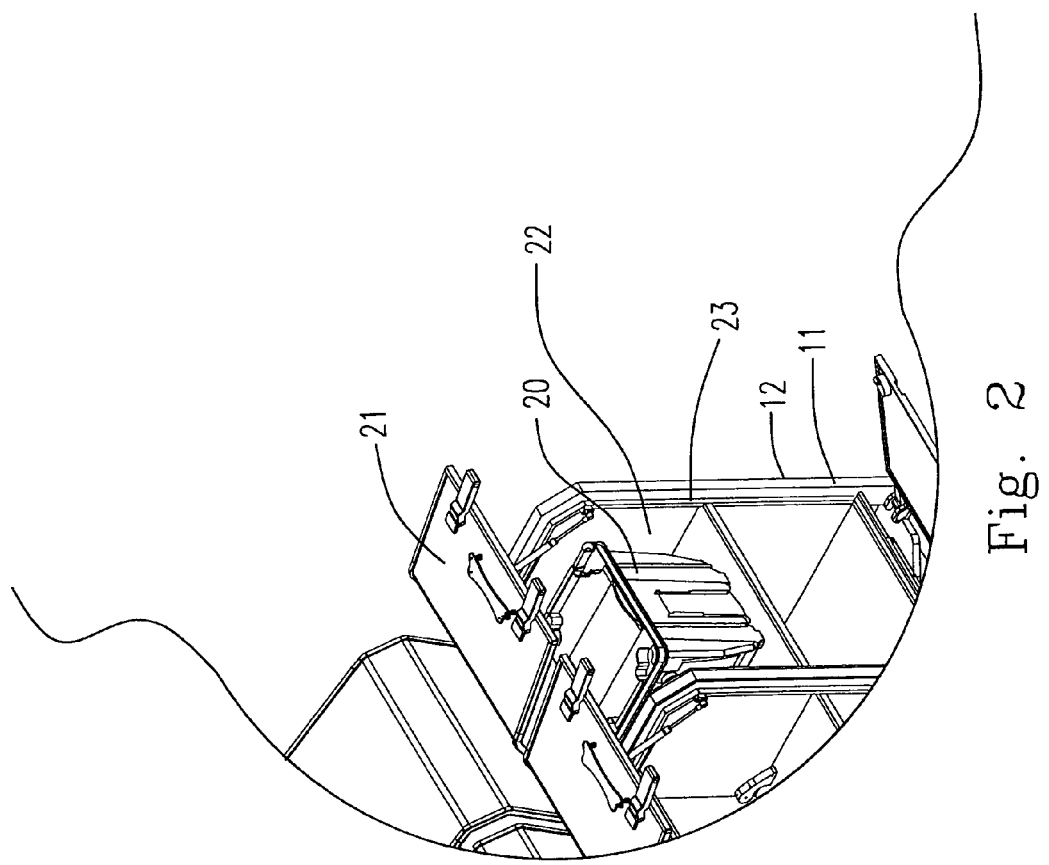
FIG. 2 is a three-dimensional view showing a nitrogen-filling system employing a foam strip according to a preferred embodiment of the present invention.
Figure 3:
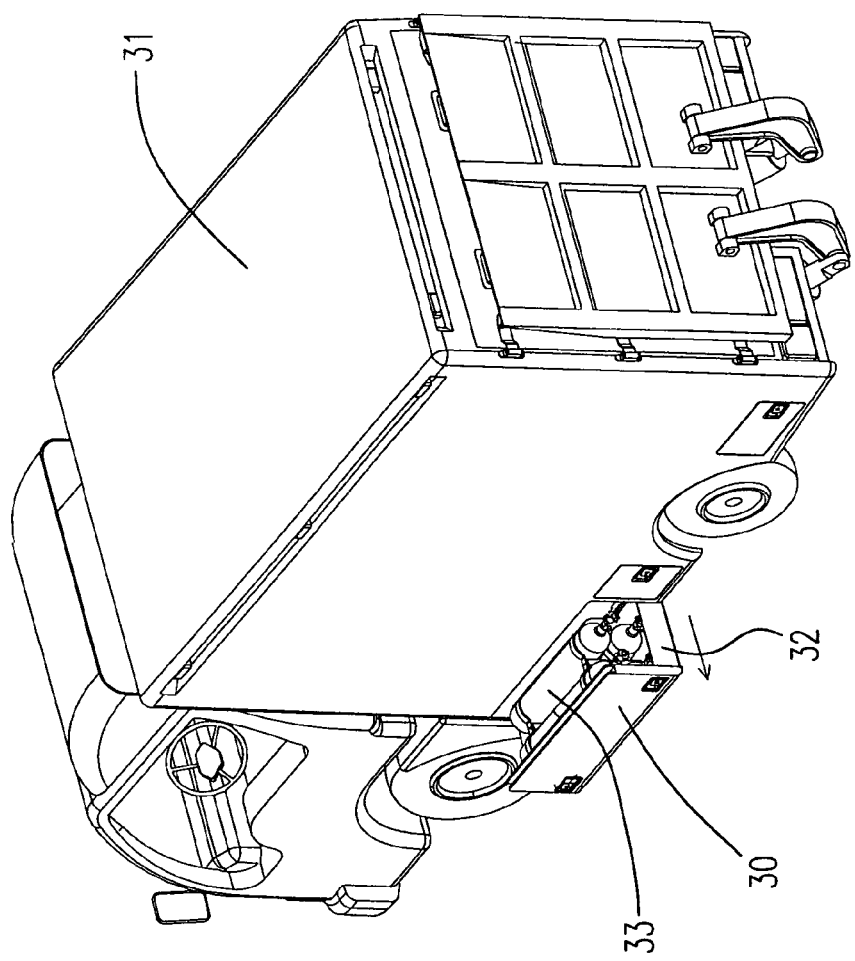
FIG. 3 is a schematic view showing a nitrogen-filling system having a pull-type cabinet according to a preferred embodiment of the present invention.

The present invention will now be described more specifically with reference to the following embodiments. Please refer to FIGS. 1–3, which illustrate a nitrogen-filling system 10 for filling the closed space 22 around the wafer box 20 with nitrogen. The nitrogen-filling system includes the carrier 11 and the nitrogen-filling apparatus 30. The carrier 11 includes the main body 12 carrying at least one wafer box 20, and the closing cover 21 mounted on the main body 12 so as to form the closed space 22. The nitrogen-filling apparatus 30 is set on the transporting vehicle 31 for filling the closed space 22 with nitrogen so as to enhance the stability of the wafers in the carrier 11.

Figure 5:
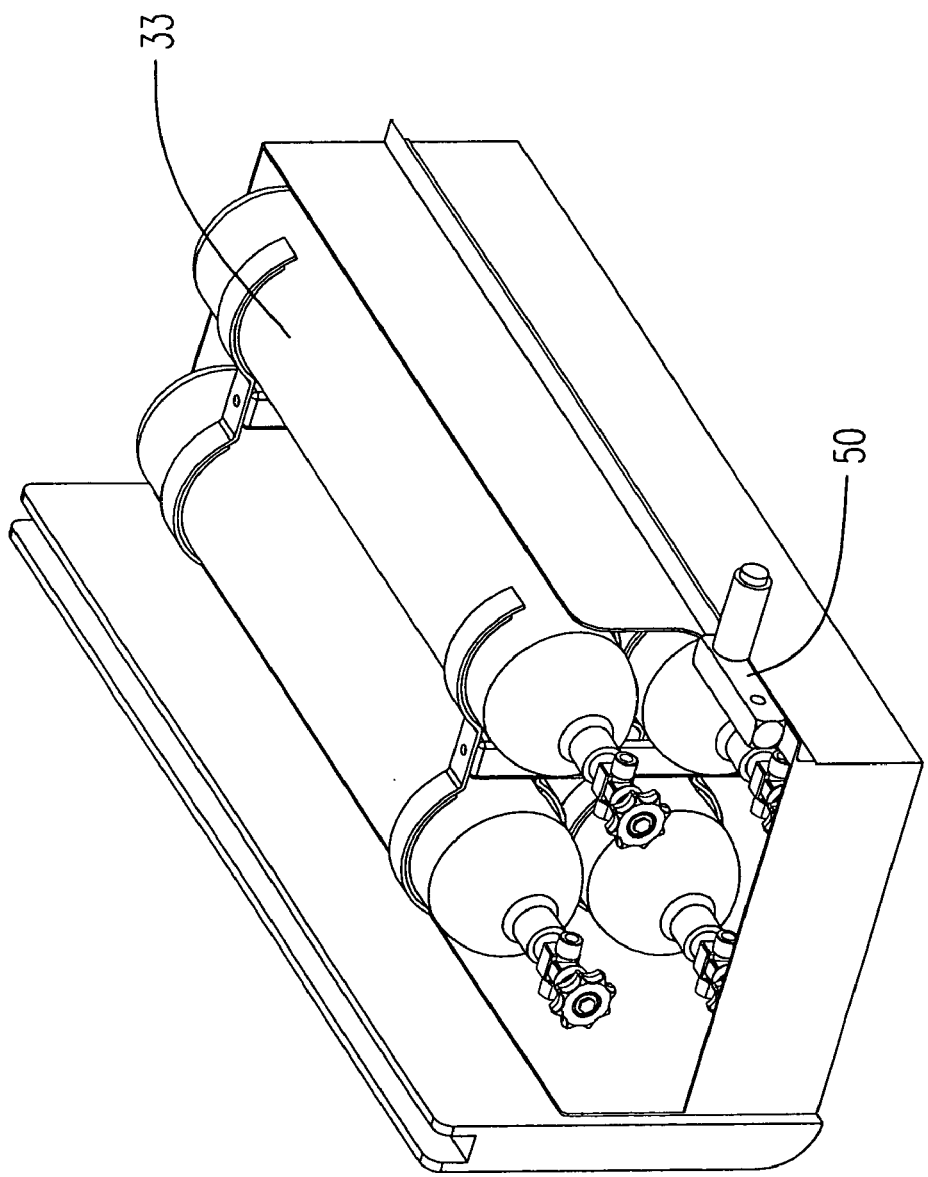
FIG. 5 is a three-dimensional view showing a pressure sensor set on the nitrogen cylinder according to a preferred embodiment of the present invention.

The nitrogen-filling apparatus 30 has the pull-type cabinet 32 for positioning and conveniently exchanging the nitrogen cylinder 33. Further, the pressure sensor 50 (FIG. 5) is set on the nitrogen cylinder 33 to detect the safe amount of nitrogen in the nitrogen cylinder 33. In addition, the nitrogen-filling apparatus 30 further includes the transporting pipe 13 for transporting nitrogen from the nitrogen cylinder 33 to the closed space 22.

Figure 4:
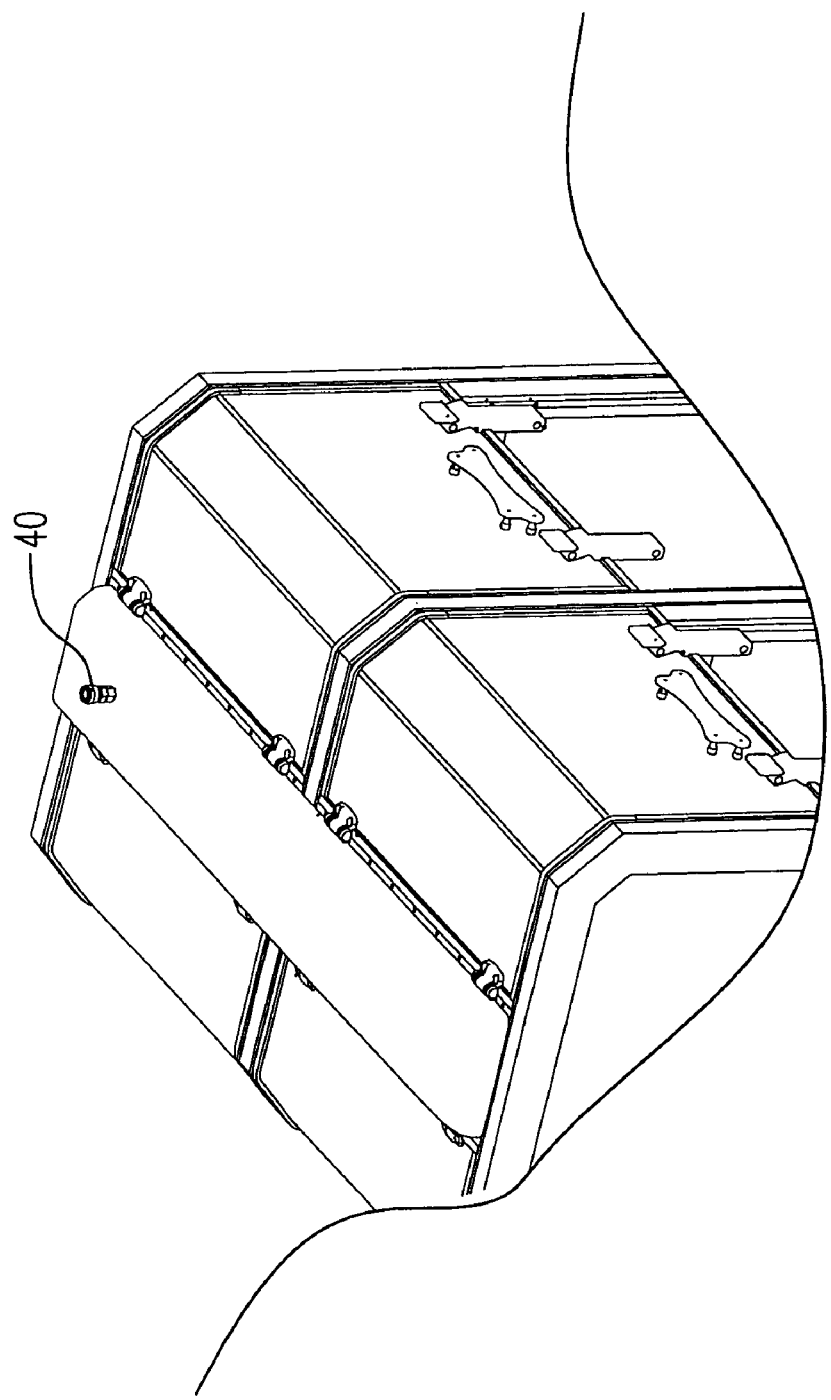
FIG. 4 is a three-dimensional view showing a check inlet on the carrier of the wafer box according to a preferred embodiment of the present invention.

According to a preferred embodiment of the present invention, the wafer box 20 is a front opening shipping box (FOSB). The carrier 11 of the wafer box 20 is a hand-operated cart. The transporting vehicle 31 is a truck. The transporting pipe 13 of the nitrogen-filling apparatus 30 is employed to connect the joint 14 of the transporting vehicle 31 and the joint 15 of the hand-operated cart 11 for forming a connection between the nitrogen-filling apparatus 30 and the hand-operated cart 11. Furthermore, the closed space 22 of the carrier 11 is an airtight space, and the joint 15 on the hand-operated cart 11 has the check inlet 40 (FIG. 4) to check an outflow of nitrogen in the airtight space 22. In addition, the foam strip 23 is sealed on the main body 12 of the carrier 11 so as to enhance an airtight effect of the carrier 11.

In another preferred embodiment, the present invention relates to the nitrogen-filling system 10 for filling nitrogen into an inner part of the carrier 11. The carrier 11 has the main body 12 and the closing element mounted on the main body 12 for forming the closed space 22. The nitrogen-filling system 10 includes the nitrogen-filling apparatus 30 for filling the closed space 22 with nitrogen so as to enhance a stability of an object in the carrier 11. Preferably, the carrier 11 carries at least one wafer box 20. The closing element 21 is a closing cover. The closed space 22 is formed around the wafer box 20. The object is a wafer in the wafer box 20. In the present embodiment, the main body 12 of the carrier 11 is not limited to carry the wafer box 20, and the other details of the embodiment have been disclosed in the previous description.

In one preferred embodiment, the present invention relates to the nitrogen-filling system 10 including the carrier 11 and the nitrogen-filling apparatus 30. The carrier 11 further includes the main body 12 for carrying at least one wafer box 20 having at least a wafer therein, and the closing cover 21 mounted on the main body so as to form a closed space 22 around the wafer box 20. The nitrogen-filling apparatus 30 is used for filling the closed space 20 with nitrogen so as to enhance a stability of the wafer in the carrier 11. In the present embodiment, the nitrogen-filling system 10 is not limited to apply to the carrier 11 of the wafer box 20, and the other details of the embodiment have been disclosed in the previous description.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A nitrogen-filling system, comprising:
   a carrier, comprising:
      a main body for carrying at least one wafer box having at least a wafer therein; and
      a closing cover mounted on said carrier main body so as to form a closed space around said wafer box; and
   a transporting vehicle for carrying said carrier and a nitrogen-filling apparatus having a transporting pipe set there on for filling said closed space with nitrogen so as to enhance a stability of said wafer in said carrier,
   wherein said wafer box is a front opening shipping box (FOSB), said carrier is a hand-operated cart, and said transporting pipe of said nitrogen-filling apparatus is employed to connect a joint of said transporting vehicle and a joint of said hand-operated cart for forming a connection between said nitrogen-filling apparatus and said hand-operated cart.

2. The nitrogen-filling system according to claim 1, wherein said nitrogen-filling apparatus further comprises: a pull-type cabinet for positioning and conveniently exchanging a nitrogen cylinder, and a pressure sensor for detecting a safe amount of nitrogen in said nitrogen cylinder.

3. The nitrogen-filling system according to claim 2, wherein said transporting pipe is used for transporting said nitrogen from said nitrogen cylinder to said closed space.

4. The nitrogen-filling system according to claim 3, wherein said closed space of said main body is an airtight space, and said joint on said hand-operated cart has a check inlet to check an outflow of said nitrogen in said airtight space.

5. The nitrogen-filling system according to claim 1, wherein a foam strip is sealed on said main body so as to enhance an airtight effect.

6. The nitrogen-filling system according to claim 1, wherein said transporting vehicle is a truck.

7. A nitrogen-filling system for filling nitrogen into an inner part of a carrier comprising a main body and a closing element mounted on said main body for forming a closed space, the nitrogen-filling system comprising:
  a nitrogen-filling apparatus having a transporting pipe for filling said closed space with nitrogen so as to enhance a stability of an object in said carrier,
  wherein said carrier is a hand-operated cart and carries at least one front opening shipping box (FOSB) therein, and said transporting pipe is employed to connect a joint of a transporting vehicle and a joint of said hand-operated cart for forming a connection between said nitrogen-filling apparatus and said hand-operated cart.

8. The nitrogen-filling system according to claim 7, wherein said closing element is a closing cover, said closed space is formed around said FOSB, said nitrogen-filling apparatus is mounted on said transporting vehicle, and said object is a wafer in said FOSB.

9. The nitrogen-filling system according to claim 8, wherein said nitrogen-filling apparatus further comprises a pull-type cabinet for positioning and conveniently exchanging a nitrogen cylinder, and a pressure sensor for detecting a safe amount of nitrogen in said nitrogen cylinder.

10. The nitrogen-filling system according to claim 9, wherein said transporting pipe is used for transporting nitrogen from said nitrogen cylinder to said closed space.

11. The nitrogen-filling system according to claim 10, wherein said closed space of said main body is an airtight space, and said joint on said hand-operated cart has a check inlet to check an outflow of nitrogen in said airtight space.

12. The nitrogen-filling system according to claim 11, wherein a foam strip is sealed on said main body so as to enhance an airtight effect.

13. The nitrogen-filling system according to claim 12, wherein said transporting vehicle is a truck.

14. A nitrogen-filling system, comprising:
  a carrier, comprising:
    a main body for carrying at least one front opening shipping box (FOSB) having at least a wafer therein; and
    a closing cover mounted on said carrier main body so as to form a closed space around said FOSB; and
  a nitrogen-filling apparatus having a transporting pipe for filling said closed space with nitrogen so as to enhance a stability of said wafer in said carrier,
  wherein said carrier is a hand-operated cart, and said transporting pipe is employed to connect a joint of a transporting vehicle and a joint of said hand-operated cart for forming a connection between said nitrogen-filling apparatus and said hand-operated cart.

15. The nitrogen-filling system according to claim 14, wherein said nitrogen-filling apparatus is set on said transporting vehicle.

16. The nitrogen-filling system according to claim 15, wherein said nitrogen-filling apparatus further comprises: a pull-type cabinet for positioning and conveniently exchanging a nitrogen cylinder, and a pressure sensor for detecting a safe amount of nitrogen in said nitrogen cylinder.

17. The nitrogen-filling system according to claim 16, wherein said transporting pipe is used for transporting nitrogen from said nitrogen cylinder to said closed space.

18. The nitrogen-filling system according to claim 17, wherein said closed space of said main body is an airtight space, and said joint on hand-operated cart has a check inlet to check an outflow of said nitrogen in said airtight space.

19. The nitrogen-filling system according to claim 18, wherein a foam strip is sealed on said main body so as to enhance an airtight effect.

20. The nitrogen-filling system according to claim 19, wherein said transporting vehicle is a truck.

* * * * *